United States Patent [19]

Su et al.

[11] Patent Number: 5,774,560

[45] Date of Patent: Jun. 30, 1998

[54] DIGITAL ACOUSTIC REVERBERATION FILTER NETWORK

[75] Inventors: Alvin Wen-Yu Su, Chang-Hwa County; Li-Wei Wang, Tao-Yuan County, both of Taiwan

[73] Assignee: Industrial Technology Research Institute, Hsinchu, Taiwan

[21] Appl. No.: 656,850

[22] Filed: May 30, 1996

[51] Int. Cl.$^6$ .................................................... H03G 3/00
[52] U.S. Cl. .................................................. 381/63; 84/630
[58] Field of Search .................... 381/63, 61; 84/630, 84/707

[56] References Cited

U.S. PATENT DOCUMENTS

| | | |
|---|---|---|
| 4,215,242 | 7/1980 | Gross . |
| 4,472,993 | 9/1984 | Futamase et al. . |
| 4,731,848 | 3/1988 | Kendall et al. . |
| 4,984,276 | 1/1991 | Smith .......................................... 381/63 |
| 5,195,140 | 3/1993 | Kudo et al. . |
| 5,369,710 | 11/1994 | Asai . |
| 5,491,754 | 2/1996 | Jot et al. .................................... 381/63 |

*Primary Examiner*—Forest W. Isen
*Attorney, Agent, or Firm*—Fish & Richardson P.C.

[57] ABSTRACT

A reverberation network for processing an audio signal including a plurality of wave-ladder filters, each of which simulates a corresponding reflected audio signal from wave propagation in a selected direction, wherein each of the plurality of wave-ladder filters receives as input a signal derived from the audio signal; and an adder which combines the corresponding reflected signals of the plurality of wave-ladder filters to produce a reverberation signal.

23 Claims, 5 Drawing Sheets

DIGITAL ACOUSTIC REVERBERATION FILTER NETWORK

BACKGROUND OF THE INVENTION

The invention relates generally to digital reverberators for audio signals.

Reverberation usually happens when the recording venues are large acoustic spaces. It is caused by multiple reflections of the original signals and their subsequent reflections from the floor, walls, and other objects. Generally, a nice-sounding acoustic space produces a sound energy pattern that has an exponential-like decay. Since human perception is more used to reverberant environments, an audio recording that is made in a non-reverberant space usually sounds unnatural.

Nowadays, many recordings are made in studios which are usually well-damped so as to produce little reverberation. In order to make the recordings sound like they were made in a real space such as an auditorium, some type of postprocessing is used, with artificial reverberation being the most popular one. An artificial reverberation apparatus must reproduce the original signals with the natural reverberations found in an acoustic environment. A nice-sounding reverberator has to satisfy at least the following criteria. The decay pattern of the sound energy has to be somewhat exponential-like. The frequency components in the middle of the audio spectrum should usually have longer reverberation than the high frequency and low frequency components. The reflections must be irregular in terms of their magnitudes and the intervals among them. The system should process both early reflections and long reverberation according to the above rules.

Traditional artificial reverberation techniques are implemented by using mechanical devices and/or electronic circuits which simulate mechanical devices. With the rapid developments in Digital Signal Processing (DSP) techniques, modern artificial reverberators are now typically digital. One of the best approaches to producing good reverberation has been to measure the impulse response of a good acoustic space and use the response as a Finite Impulse Response (FIR) filter which convolves with the original signal. The number of taps of such a filter is usually from a few thousands to tens of thousands. In most applications, however, such implementations are certainly not practical. Therefore, most digital reverberators make use of both Finite Impulse Response (FIR) filters for early reflections and Infinite Impulse Response (IIR) filters for long reverberation. Difficulties arise, however, from the IIR filters used in the reverberators. First of all, they produce a comb filter effect which can be very annoying to human ears. Secondly, the sound tends to become very bright and sometimes piercing toward the end of the reverberation. Thirdly, if there are any filters in the feedback loop of the IIR filters, it is very difficult to handle the stability problem. Finally, it is very difficult to relate the sound characteristics with the characteristics of the filters.

SUMMARY OF THE INVENTION

One of the reasons why it is difficult for conventional techniques to produce high quality reverberation is that the underlying models of such techniques are not related to the acoustic environments which those models are supposed to imitate. Rather, artificial reverberation is used to stimulate the reverberation generated from a real room.

We have therefore developed a reverberation technique which is based upon modeling an imaginary acoustic room. In general, the technique is based on using a digital filter called a digital wave-ladder filter to simulate a 1-D acoustic wave propagation. An imaginary room is constructed by using multiple digital wave-ladder filters which are connected based on the geometry of the imaginary room. Spatial Distribution Matrices (SDWs) are used to connect the digital wave-ladder filters and to simulate the redistribution of the sound-waves when multiple sound-waves meet at a various spatial locations. The filters together with the SDM's, form an artificial reverberation filter network, the stability of which is easily achieved if the filters and SDM's are lossy from the energy point of view. It is also very easy to adjust the system parameters such as the size of the imaginary room, and reverberant gain, without affecting the stability of the system. In order to generate realistic early reflections, an FIR filter is used before the signal enters the filter network.

In general, in one aspect, the invention is a class of filter networks which generates artificial reverberation for audio signals. The basic elements of the filter networks are derived from models of 1-D wave propagation. The basic elements are then connected by Spatial Distribution Matrices. The structure of the networks can be arranged to imitate an imaginary acoustic space. The purpose of using such filter networks is to simulate the propagation of sound waves in that space. Reverberation effects are obtained by feeding the audio signal to an FIR filter for early reflections and the results are then fed to the filter network for late reflections. The stability of the filter network is also guaranteed.

In general, each component of the claimed invention is well known to persons working in the areas of digital signal processing and room acoustics. The concepts of imaginary rooms, ladder filters and SDWs are also know to persons skilled in the art. In one aspect, the invention involves combining these known techniques and technologies to generate good reverberation (e.g. natural sounding, stable, and flexible).

Another aspect of the invention involves simply using principles of wave-propagation to construct a reverberator that sounds good.

The invention will generate artificial reverberation that sounds more realistic than is achievable using conventional reverberation techniques. It can readily be used generally to post-process audio signals. It also has many applications in home and commercial entertainment settings, including for example theaters, music halls, karaoke, etc.

Other advantages and features will become apparent from the following description of the preferred embodiment and from the claims.

DESCRIPTION OF THE PREFERRED EMBODIMENTS

Figure 1:
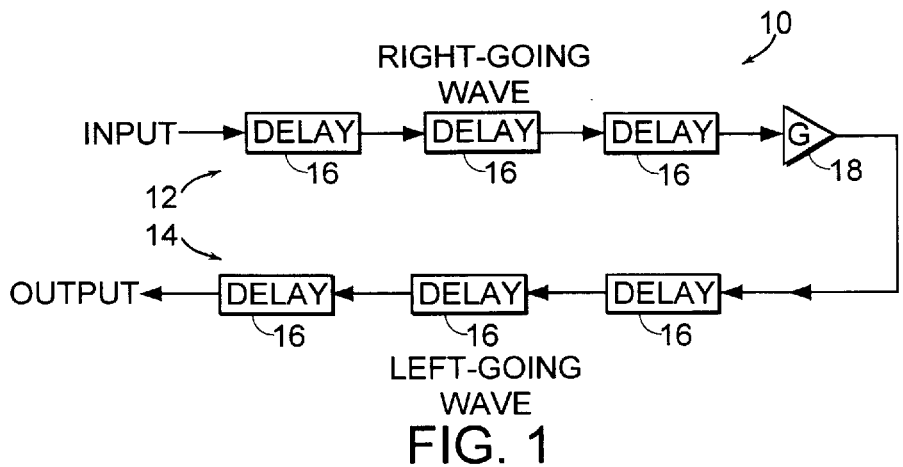
FIG. 1 is a block diagram of a system which produces a discrete-time approximation of 1-dimensional wave propagation.

The described embodiment of the invention is a digital reverberator which post-processes audio recordings. The input audio signal is processed in two stages. An Finite Impulse Response (FIR) filter simulates early reflections and a digital acoustic filter network simulates long reverberation. The digital reverberator is based on modeling of the propagation of sound waves. That is, the continuous-time solution of the 1-dimensional wave equation is converted to its discrete-time counterpart, which is can be implemented by a digital filter 10, as shown in FIG. 1. This technique for digitally modeling the propagation of sound waves is well known to persons skilled in the art and it is described in standard textbooks concerning digital speech processing. For example, see L. R. Rabiner et al., *Digital Processing of Speech Signals*, Prentice-Hall, Inc., 1978.

FIG. 1 shows a lossless digital wave-ladder filter which simulates 1-dimensional wave propagation with a single reflection off of an object, e.g. a wall. The input signal is the audio signal from the source and the output signal is the reflected signal which arrives back at the source. This simple digital wave-ladder filter includes an upper branch for simulating the outgoing sound wave and a lower branch for simulating the returning wave after it has reflected off of the wall. Each branch is constructed from a set of delay modules 16. The total number of modules in each branch and the amount of delay associated with each module 16 depends upon the size of the imaginary acoustic space that is being modeled. A gain module 18 connected the upper branch 12 to lower branch 14 at the far end, i.e., the end corresponding to the wall, accounts for the sound reflection properties of the wall. The gain of gain module 18 is typically less than 1 to account for the sound attenuation which occurs at the reflecting surface. The delay of delay modules 16 and the gain of gain module 18 are programmable so as to enable the sound characteristics of this simple filter to be manipulated by the user.

Figure 2:
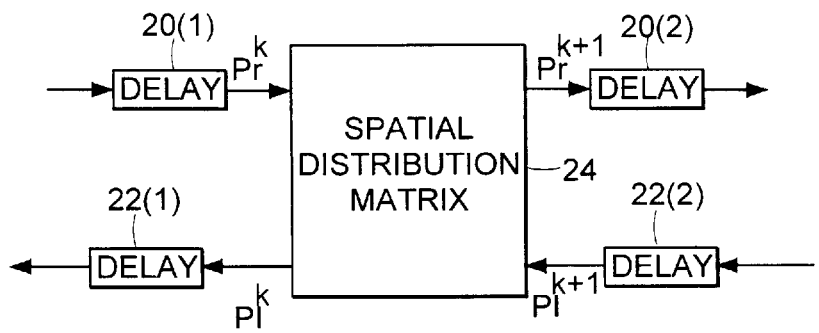
FIG. 2 is a block diagram of a system which simulates signal reflections and transmissions occurring at a junction.
Figure 3:
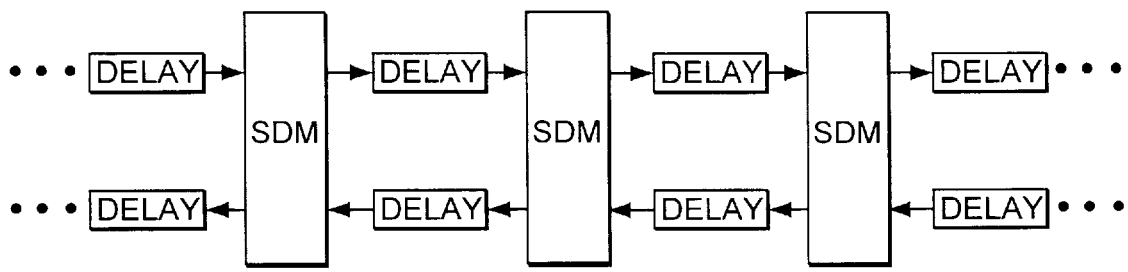
FIG. 3 is a block diagram of a discrete-time implementation of 1-dimensional wave propagation with multiple reflection junctions.

Since sound waves can also reflect off objects located between the source of sound and the final reflecting wall, that situation is simulated by the filters shown in FIGS. 2 and 3. FIG. 2 shows one section of a lossless digital wave-ladder filter which simulates 1-dimensional wave propagation with a single intermediate reflection that is modeled by a Spatial Distribution Matrix (SDM) 24. Though not shown, it is assumed that the far wall is modeled by a gain module connecting the upper branch to the lower branch on the right side of the network, as previously described in connection with FIG. 1. In this example, four delay modules 20(1), 20(2), 22(1), and 22(2) are used. Delay module 20(1) accounts for the time it takes for the acoustic wave to travel from some predetermined location to the junction, which is modeled by SDM 24, and delay module 22(1) accounts for the time it takes the reflected acoustic wave from SDM 24 to return over the same path to that predetermined location. Thus, it is desirable for the delays associated with modules 20(1) and 22(1) to be the same, as is true for all delay modules which model the same portions of the acoustic path.

The network of FIG. 2 can be used to simulate an acoustic wave passing through a junction, e.g. a doorway, into a different sized space, e.g. a neighboring room. Part of the acoustic wave passes through the junction and part of it reflects back. Similarly, the returning acoustic wave also experiences the same effect at the junction; that is, part of it passes through the junction back into the main space and part of it reflects back into the neighboring space. The amount of reflection and transmission can be precisely determined if the physical conditions of the of the space are known. However, those are typically quite difficult to measure and model. Thus, it is more practical to simply generate an imaginary acoustic space of arbitrary design, as mentioned above, and modifying the control variables, e.g. the delay and the coefficients of the SDM, to produce the desired acoustic reverberation affect.

SDM 24 is a two-by-two matrix with the diagonal coefficients modeling the portion of the acoustic wave that passes through the junction and the off-diagonal coefficients modeling the portion of the acoustic wave that reflects back from the junction.

Figure 4:
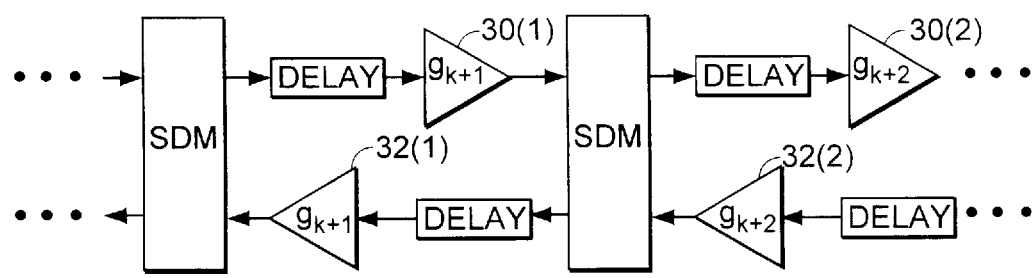
FIG. 4 is a block diagram of a discrete-time implementation of 1-dimensional wave propagation with reflection junctions and using attenuators to simulate a lossy signal path.
Figure 5:
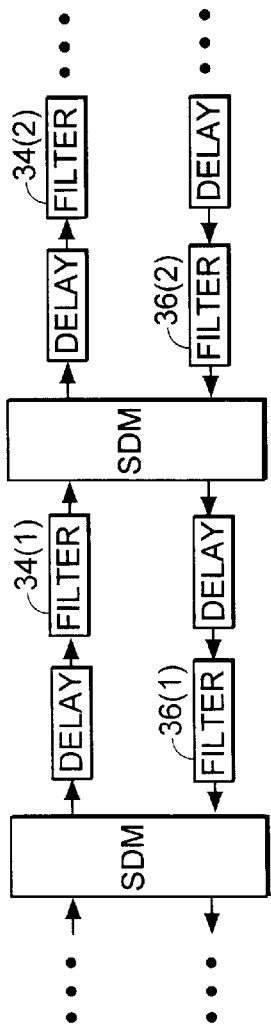
FIG. 5 is a block diagram of a discrete-time implementation of 1-dimensional wave propagation with reflection junctions and using digital low-pass filters on the signal path to simulate a lossy signal path.

FIG. 5 shows a concatenation of three of the acoustic filters are illustrated in FIG. 4. This configuration can be used to simulate multiple partially reflecting objects in the acoustic path between the source and the wall, each intermediate object reflecting back some portion of the acoustic wave.

The delays are determined by the size of the imaginary room that is being modeled. Theoretically, the reflection coefficients can also be calculated from knowing the characteristics of the imaginary space, such as its geometry and its air density. It is, however, very difficult to do this in practice. Thus, it is intended that the user have great flexibility in selecting delays and coefficients and that they are primarily chosen on the basis of what produces good acoustic results.

Since acoustic energy typically decays in space, it might also be desirable to add damping factors into the digital wave-ladder filter, as shown in FIGS. 4 and 5. Both FIGS. 4 and 5 show lossy digital wave-ladder filters which simulate 1-dimensional wave propagation with reflections modeled through SDM's. Their construction is similar to that shown in FIG. 3, except that additional modules are inserted into the acoustic pathways to model energy attenuation. In the case of FIG. 4, for the branch simulating the outgoing acoustic wave, the added modules are gain modules 30(1) and 30(2), which have gains $g_{k+1}$ and $g_{k+2}$ respectively; and for the branch simulating the reflected acoustic wave, the added modules are gain modules 32(1) and 32(2), which have gains $g_{k+1}$ and $g_{k+2}$, respectively. In the case of FIG. 5, the added modules in one branch are filter modules 34(1) and 34(2); and the added modules in the other branch are filter modules 36(1) and 36(2).

Note that generally it is desirable that the gain modules for the same portion of the modeled acoustic path have the identical gain, as shown in FIG. 4. Thus, the same damping will be applied for the acoustic energy traveling in opposite directions over the same portions of the acoustic path. In other words, gain modules 30(1) and 32(1) have identical gains and gain modules 30(2) and 32(2) have identical gains, as illustrated.

Figure 8:
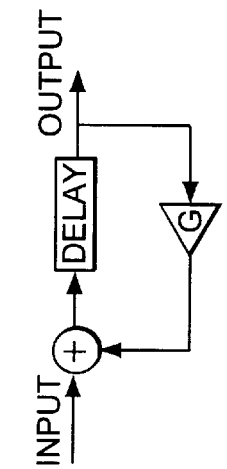
FIG. 8 is a block diagram of an IIR comb filter.
Figure 7:
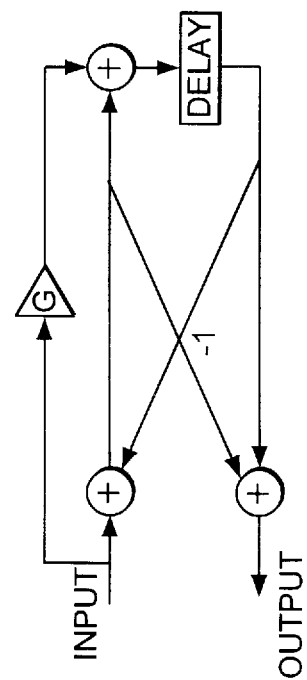
FIG. 7 is a block diagram of an IIR all-pass filter.

In the case of the lossy digital wave-ladder filter shown in FIG. 5, the digital filters can be either FIR filters or IIR filters, such as are shown in FIGS. 7 and 8, respectively. Since both of these structures are well known in the art further details can be found in many standard texts on filter design and acoustic modeling. The filters will typically be low-pass filters to account for absorption by air. As is well known, the high frequencies usually die out faster than the low frequency signals. Of course, in designing an imaginary acoustic space one need not necessarily follow these rules. Indeed, it is permissible to model the room so that the low frequency signals die out faster than the high frequency signals, if that produces an acoustic result that seems preferable. In any event, one can control the rate of fade out by assigning different filters to the model.

Figure 6:
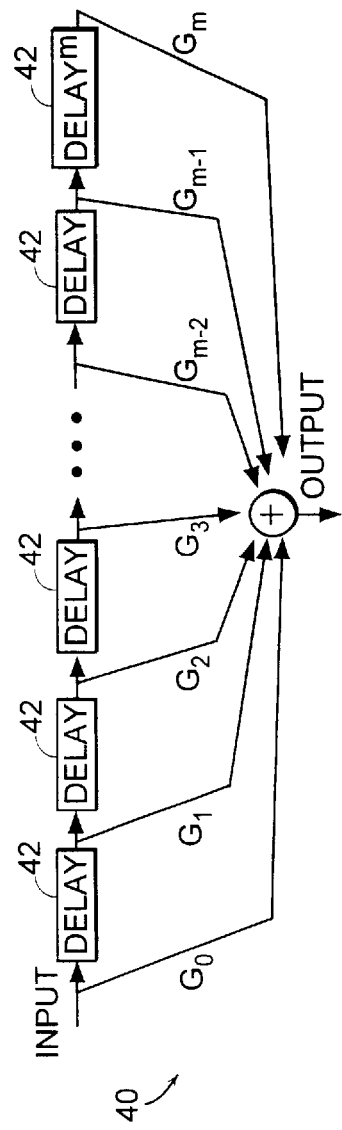
FIG. 6 is a block diagram of an FIR filter for simulating early reflections.

For early reflections, it typically takes too much memory and computational power to use the above-described digital wave-ladder filters to model the entire environment. Therefore, to reduce both the memory and computational power requirements, a FIR filter 40, such as is shown in FIG. 6, is used to simulate the near reflections. The delay modules 42 typically each produce identical delays and the weights are shown as $G_i$. (Note, however, that the delays need not be identical.) Thus, the output of this filter as a function of an input signal $i_k$ is as follows:

$$Output = G_m i_{k-m} + G_{m-1} i_{k-m+1} + \ldots + G_1 i_{k-1} + G_0 i_k$$

The concept of early reflections is discussed in books such as *Elements of Computer Music*, by J. Moore published by MIT Press. In general, early reflections refer to the reflections that are typically caused by the floor, the ceiling, and other objects or structures located near the sound source. Usually, the delay associated with early reflections lies between 0 and about 100 msec, for example.

The weights and delays of the FIR filter are determined in ways that are well known to persons skilled in the art, so the details are not provided here. In general, however, the best way is to simply measure the impulse response of an acoustically good space, such as Carnegie Hall in New York, to within 100 msec. The impulse response can then be used as the FIR filter. That approach, however, would be computationally very intensive and time consuming.

Figure 9:
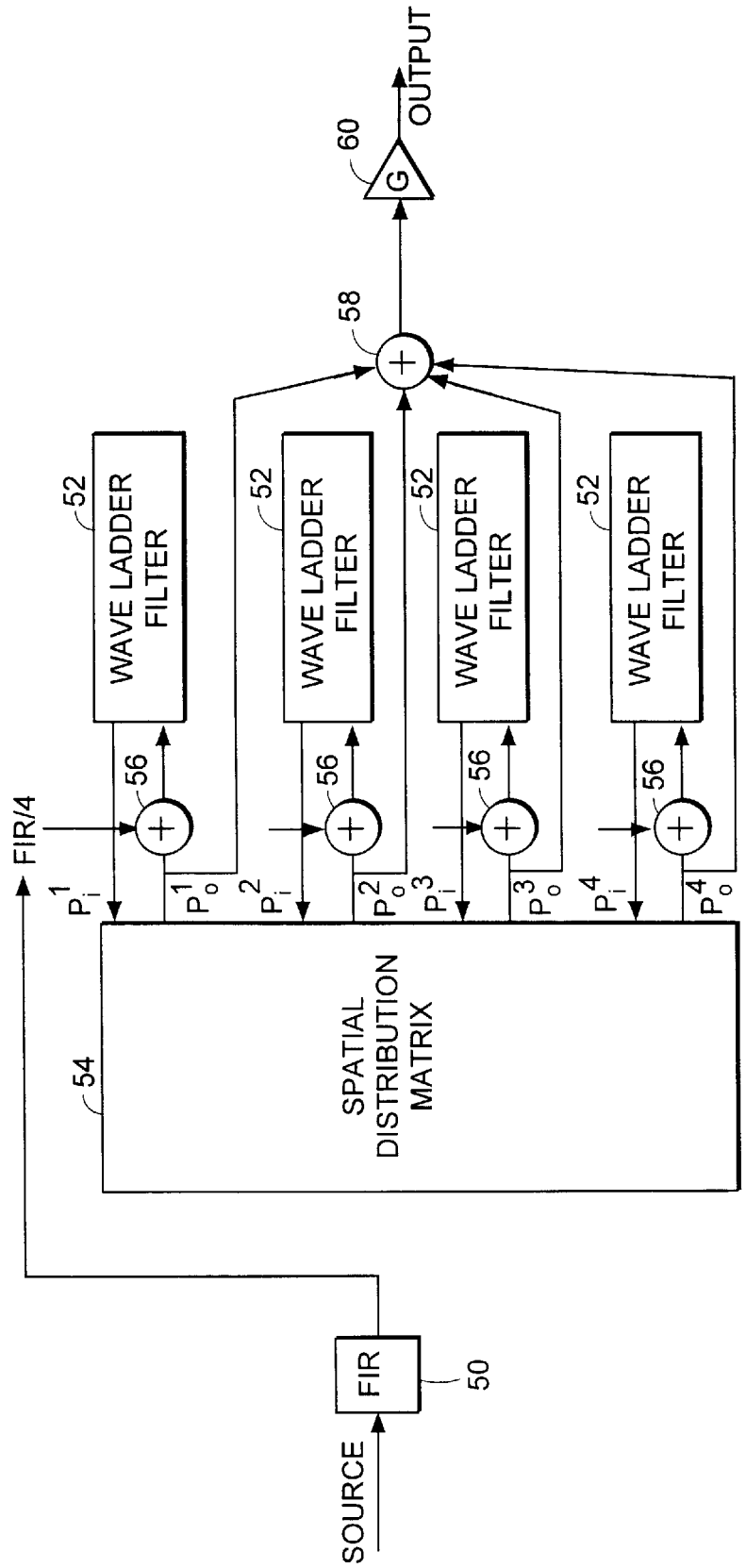
FIG. 9 is a block diagram of a reverberator which uses an FIR filter followed by a filter network including four wave-ladder filter sections.

FIG. 9 shows a block diagram of a reverberator that is constructed using the digital wave-ladders described above. A digitized input signal (i.e., the digitized audio signal) is processed by a FIR filter 50 which generates the simulated early reflections.

The filtered signal is then fed to a network of digital wave-ladder filters 52 which generates the late reflections. In this embodiment, the network includes four digital wave-ladder filters 52 coupled through an SDM 54. The digital wave-ladder filters are constructed in accordance with the principles described above. SDM 54 combines the feedback signals from the digital wave-ladder filters (i.e., the signals labeled $p^j_i$, where $j=1,\ldots,4$) to produce output signals (i.e., the signals labeled $p^j_o$), which after being combined with the FIR output signal, produce the input signals for the individual digital waveladder filters. SDM 54 calculates the simulated acoustic pressures from the feedback signals of the multiple signal paths represented by the multiple digital wave-ladder filters. Then, SDM 54 calculates the outgoing acoustic pressures (i.e., $p^j_o$) which are then fed back into the digital wave-ladder filters.

SDM 54, which has four input paths, implements the following matrix operation:

$$p_{out} = \begin{bmatrix} p_o^1 \\ p_o^2 \\ p_o^3 \\ p_o^4 \end{bmatrix} = J \begin{bmatrix} p_i^1 \\ p_i^2 \\ p_i^3 \\ p_i^4 \end{bmatrix} = J p_{in}$$

where $p^j_o$, for $j=1,2,3,4$, represents the signal of the j-th path flowing out of the SDM and $p^j_i$, for $j=1,2,3,4$, represents the signal of the j-th path flowing into the SDM. In this example, J is a 4 by 4 matrix. The size of the SDM, of course, depends on the number of inputs flowing into it. The coefficients of the SDM matrices can be readily derived using well known acoustic theory or they may be assigned somewhat arbitrarily. Regardless of the approach, however, to achieve stability, it is required that the magnitudes of eigenvalues of the SDM be bounded by unity.

The SDM's that are used in the digital-wave ladder filters to model reflecting junctions have the same general form as that shown above, but typically with only two input paths. Thus, J for those SDM's is a 2 by 2 matrix.

The output of the FIR filter, attenuated by a factor 1/n, where n=4 (i.e., the number of digital wave-ladder filters), is added to each of the outputs of SDM 54 by adders 56 to produce the inputs to the individual digital wave-ladder filters. Another adder 58 combines the output acoustic pressures of SDM 54 to form the reverberant signal; and an attenuator 60, with programmable gain G, controls the intensity of the reverberant signal.

The particular design and construction of the digital wave-ladder filters is not of central importance, but rather it is their use to model an imaginary acoustic space that is key. The specific design and construction of the digital wave-ladder filters is left to the discretion of the system designer and it will, of course, depend upon subjective factors such as the quality and/or character of the sound that is desired from the system. Usually, however, the more complex the system that is modeled, the better the sound. In addition, users of a more complex system can be given greater freedom to adjust parameters and further tailor the sound produced by the reverberator.

Figure 11B:
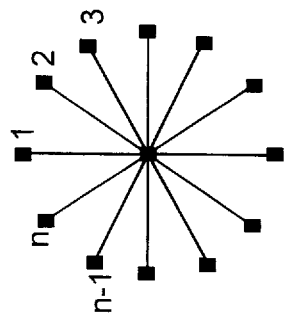
FIGS. 11a and 11b are block diagrams of imaginary rooms around which filter networks can be built.
Figure 10:
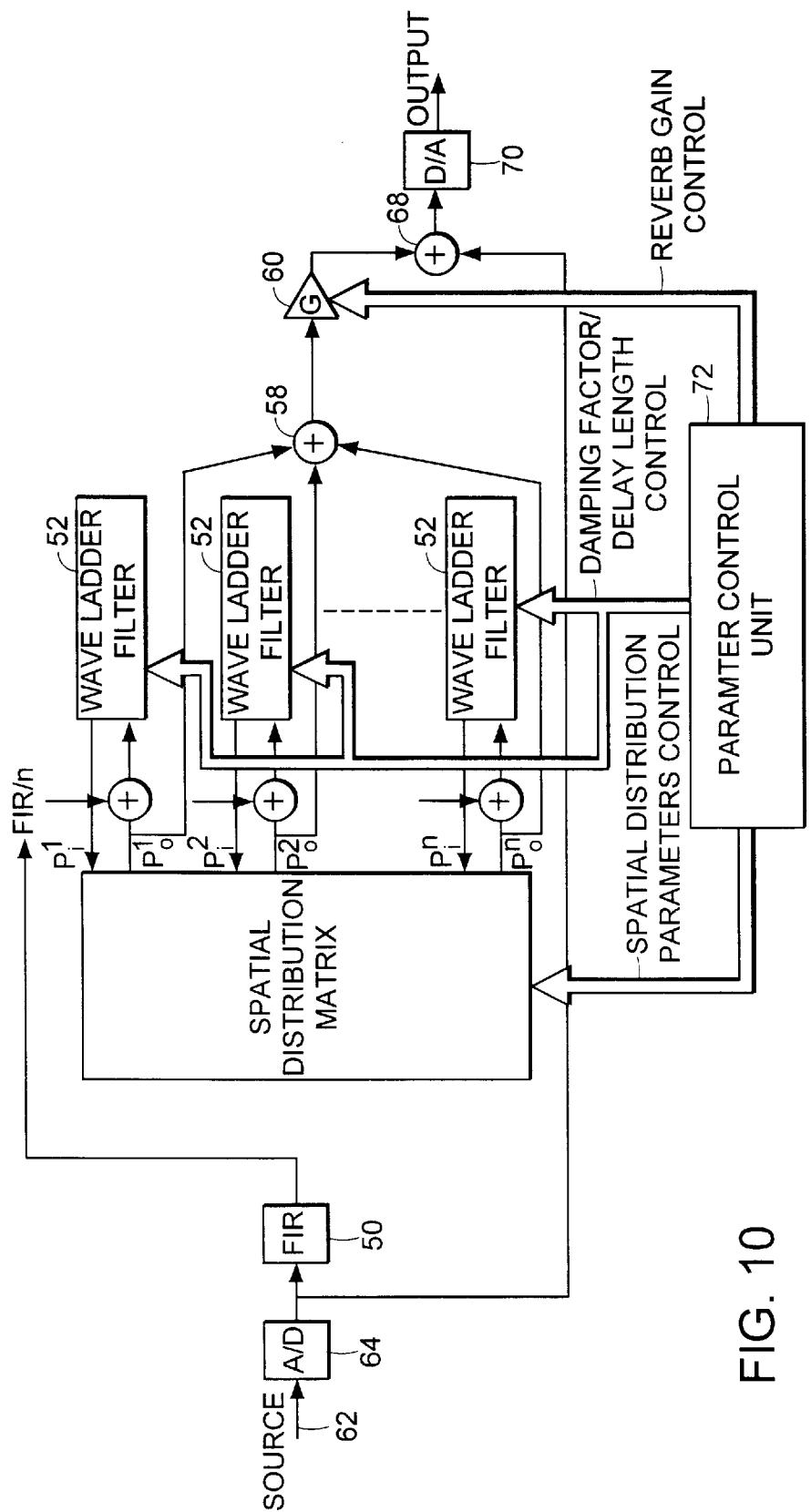
FIG. 10 is a block diagram of a digital reverberation filter network together with the supporting functions.

An exemplary embodiment of a complete reverberation network is shown in FIG. 10. The system is designed to model the acoustic characteristics of an imaginary room, such as the one shown in FIG. 11b. The number of digital wave-ladder filters equals the number of branches that are used to model the acoustic space, which in FIG. 11b is n=12. An audio signal 62 is first sampled by an A/D converter 64 and this becomes the input signal to the FIR filter 50. The core portion of this circuit is the same as shown in FIG. 9, except that in this case there are 12 digital wave-ladder filters in stead of four. Also in this particular example, J, the matrix which implements the SDM, is a 12 by 12 matrix.

Finally, the attenuated reverberant signal at the output of attenuator 60 is combined with the original signal, representing the direct sound signal, by an adder 68. The resulting digital signal is then fed to a D/A converter 70 to generate the final output analog signal.

A parameter control unit 72, which can be implemented on a microprocessor or on dedicated hardware, controls the lengths of the digital wave-ladder filters (i.e., the delays), the attenuation of the sound waves (e.g. the gains), the spatial distribution pattern, and the reverberant attenuation. Controlling these parameters is equivalent to changing the acoustic characteristics of the imaginary room, though the general shape for the configuration of the room remains unchanged.

Figure 11A:
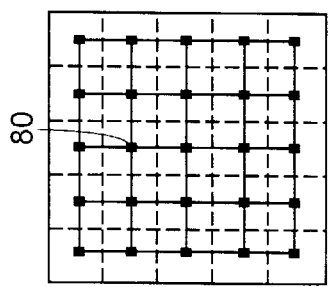

The design procedure starts by constructing a model for an imaginary room, such as the one shown in FIGS. 11a and b. The block nodes in those figures are the SDM's which are designed according to the principles described above. The branches represent the digital wave-ladder filters. The blocks nodes located at the ends of the branches are programmed such that they represent pure reflection with attenuation and without signals coming from the other direction.

The model is constructed in accordance with well known principles such as are described in standard texts on the subject of room acoustics, including for example, *Fundamentals of Acoustics* published by John Wiley Co., *Concert Hall Acoustics* published by Springer Verlag Co. and papers appearing in the reprints of the Journal of Acoustics Society of America. The imaginary room can be of any shape or size depending on the user's specification. Next, the specific desired acoustic characteristics of the imaginary room should be selected, including for example its dimensions and shape and whether it is a lively or dead room.

The number of units of delay in each digital wave-ladder filter depends on the dimensions of the branches of the imaginary room. The gain factors are generally set to magnitudes less than unity. If filters are used in the digital wave-ladder filters, it is desirable that they be set to approximate the way energy decays in a real acoustic environment. Therefore, low-pass filters or band-pass filters would be typically preferred.

It is helpful to keep in mind several additional rules when constructing a model. For example, if only a few ladder filters are used in the system, the amount of delay in each digital wave-ladder filter should not be too large. In addition, the total delay associated with each branch should not be an integer multiple of the delays associated with the other branches. If this restriction is not followed, some frequencies associated with the common delay length will tend to be over-emphasized, which usually tends to produce undesirable acoustic results. A similar rule also applies to the coefficients within the SDM's. That is, the coefficients that are used in the SDM's should be less than 1 to guarantee system stability and it is also advantageous to use different and random values which will thus tend to achieve more natural sound. The consequences, however, of not following this rule closely is not as serious as failing to follow the rule regarding the relative delay lengths of the branches.

A simple model for a 3-dimensional acoustic space, which accounts for reflections off of each of the four walls, the floor and the ceiling of the room, will include six branches, one for each reflecting surface. In that case, the J matrix would be a 6 by 6 matrix.

An even more complex model for an imaginary acoustic space is shown in FIG. 11a. In the case of FIG. 11a, the individual branches are interconnected through the SDM's at intersections of the branches. Thus, for example, SDM 80 couples outgoing and reflected signals for two intersecting branches. Thus, the J matrix within the SDM is actually a 4 by 4 matrix. The restriction still applies, however, that the eigenvalues for that matrix need to be less than unity.

It should also be understood that the above-described techniques can also be used to model an actual acoustic space. In that case, however, the design of the digital wave-ladder filters and the selection of variables values would considerably more difficult than producing a model for an imaginary acoustic space.

Though the described embodiment is a digital implementation, it should be understood that the invention can also be implemented using analog circuitry or a combination of digital and analog circuitry. Of course, if an analog implementation is used, the A/D and D/A converters shown in FIG. 10 would no longer be necessary.

Other embodiments are within the following claims.

What is claimed is:

1. A reverberation network for processing an audio signal, said reverberation network comprising:

a plurality of wave-ladder filters, each of which simulates a corresponding reflected audio signal from wave propagation in a selected direction, wherein each of said plurality of wave-ladder filters receives as input a signal including a component derived from the audio signal before the audio signal passes through any of the wave-ladder filters; and an adder which combines the corresponding reflected signals of said plurality of wave-ladder filters to produce a reverberation signal.

2. The reverberation network of claim 1 wherein at least one of said wave-ladder filters comprises one or more secondary spatial distribution matrix modules which simulate intermediate reflecting objects.

3. The reverberation network of claim 2 wherein the wave-ladder filters of the plurality of wave-ladder filters are digital wave-ladder filters.

4. The reverberation network of claim 3 wherein more than one of said wave-ladder filters comprises one or more secondary spatial distribution matrix modules which simulate intermediate reflecting objects.

5. The reverberation network of claim 3 further comprising a primary spatial distribution matrix module to which the plurality of wave-ladder filters are coupled, wherein said primary spatial distribution matrix module receives as input the corresponding reflected audio signals from the plurality of wave-ladder filters and generates as output a plurality of output signals that are fed to inputs of the wave-ladder filters.

6. The reverberation network of claim 5 wherein each of said more than one of said wave-ladder filters comprises one or more secondary spatial distribution matrix modules which simulate intermediate reflecting objects.

7. The reverberation network of claim 3 wherein said at least one of said wave-ladder filters further comprises one or more gain elements which simulate a decay in the reflected audio signal for that wave-ladder filter.

8. The reverberation network of claim 3 wherein said at least one of said wave-ladder filters further comprises one or more filters which simulate a frequency-dependent decay in the reflected audio signal for that wave-ladder filter.

9. The reverberation network of claim 8 wherein said one or more filters are selected from a group of filters consisting of a low-pass filter and a band-pass filter.

10. The reverberation network of claim 8 wherein said at least one of said wave-ladder filters further comprises one or more gain elements which simulate a decay in the reflected audio signal for that wave-ladder filter.

11. The reverberation network of claim 5 wherein the primary spatial distribution matrix is characterized by eigenvalues that are all bounded by unity.

12. The reverberation network of claim 5 wherein each of said one or more secondary spatial distribution matrix modules is characterized by eigenvalues that are all bounded by unity.

13. The reverberation network of claim 5 further comprising a FIR filter which processes the audio signal to simulate early reflections.

14. The reverberation network of claim 5 wherein the plurality of wave-ladder filters and the primary spatial distribution matrix module include variable elements which control the transfer characteristics of thereof.

15. The reverberation network of claim 14 wherein the variable elements include delay modules with variable delays.

16. The reverberation network of claim 14 further comprising a parameter control unit which controls the variable elements in the plurality of wave-ladder filters and the primary spatial distribution matrix module.

17. The reverberation network of claim 16 wherein the variable elements include delay modules with variable delays.

18. The reverberation network of claim 15 wherein the variable elements include gain modules with variable gains.

19. The reverberation network of claim 16 wherein the primary spatial distribution matrix module includes variable coefficients which are controlled by the parameter control unit.

20. The reverberation network of claim 14 further comprising a FIR filter which processes the audio signal to simulate early reflections.

21. The reverberation network of claim 20 further comprising an output gain module which amplifies or attenuates the reverberation signal by a controllable gain factor.

22. The reverberation network of claim 21 further comprising a second adder which combines the amplified gain controlled reverberation signal with the audio signal to produce an output audio signal.

23. A reverberation network for processing an audio signal, said reverberation network comprising:

a plurality of wave-ladder filters, each of which simulates a corresponding reflected audio signal from wave propagation in a selected direction and has a near end and a far end, wherein the far end of each of said plurality of wave-ladder filters is terminated so as to simulate a reflecting surface and wherein each of said plurality of wave-ladder filters receives as input at its near end a signal derived from the audio signal, and outputs a reflected signal at its near end; and an adder which combines the corresponding reflected signals of said plurality of wave-ladder filters to produce a reverberation signal.

* * * * *